United States Patent [19]
Waterson et al.

[11] Patent Number: 6,127,086
[45] Date of Patent: Oct. 3, 2000

[54] PHOTOSENSITIVE RESIN COMPOSITIONS

[75] Inventors: Pamela J. Waterson, Northbridge, Mass.; Ahmad Naiini, Warwick, R.I.; Steve Lien-Chung Hsu, Tainan, Taiwan; William D. Weber, Cranston, R.I.

[73] Assignee: Arch Specialty Chemicals, Inc., Norwalk, Conn.

[21] Appl. No.: 09/406,007

[22] Filed: Sep. 24, 1999

Related U.S. Application Data

[60] Provisional application No. 60/102,694, Oct. 1, 1998.
[51] Int. Cl.$^7$ ............................. G03F 7/023; G03F 7/30
[52] U.S. Cl. ........................ 430/190; 430/191; 430/192; 430/193; 430/326
[58] Field of Search ................................. 430/190, 191, 430/192, 193, 326

[56] References Cited

U.S. PATENT DOCUMENTS

| 4,395,482 | 7/1983 | Ahne et al. | 430/326 |
|---|---|---|---|
| 5,037,720 | 8/1991 | Khanna | 430/190 |
| 5,449,584 | 9/1995 | Banba et al. | 430/190 |

*Primary Examiner*—John S. Chu
*Attorney, Agent, or Firm*—Ohlandt, Greeley, Ruggiero & Perle

[57] ABSTRACT

A positive photosensitive resin composition comprising (a) a silane diol such as diarylsilane diol or dialkylsilane diol, (b) one or more capped polybenzoxazole precursors having the structure:

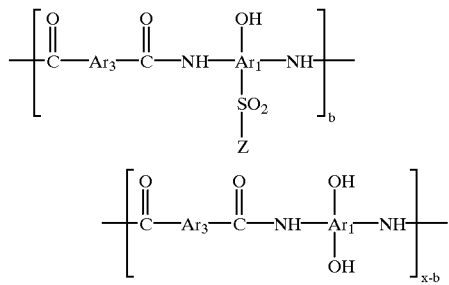

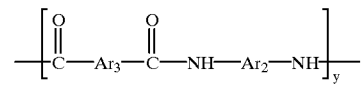

wherein $Ar_1$ is a tetravalent aromatic group, aliphatic group, heterocyclic group, or mixtures thereof; $Ar_2$ is a divalent aromatic, heterocyclic, alicyclic, or aliphatic group that optionally may contain silicon; $Ar_3$ is divalent aromatic group, aliphatic group, heterocyclic group, or mixtures thereof;

Z is one of the following groups:

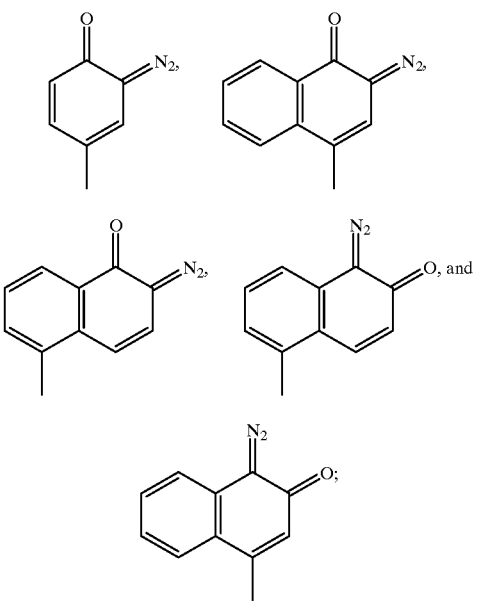

x is 10 to 1000; y is 0 to 900; and b is 0.10 to 350;

(c) a photosensitive agent, and (d) a solvent. The composition optionally includes an adhesion promoter, leveling agent, or mixtures thereof.

22 Claims, No Drawings

PHOTOSENSITIVE RESIN COMPOSITIONS

This application claims priority from U.S. Provisional Application Ser. No. 60/102,694 filed on Oct. 1. 1998.

FIELD OF THE INVENTION

The present invention relates to positive photosensitive resin compositions. More specifically, the present invention relates to positive-working, aqueous base developable photosensitive polybenzoxazole (PBO) precursor compositions that are suitable for applications in the field of microelectronics.

BACKGROUND OF THE INVENTION

In microelectronic applications, polymers that demonstrate high temperature resistance are generally well known. Precursors of such polymers, such as polyimides and polybenzoxazoles can be made photoreactive with suitable additives. The precursors are converted to the desired polymer by known techniques such as exposure to high temperatures. The polymer precursors are used to prepare protective layers, insulating layers, and relief structures of highly heat-resistant polymers.

Conventional positive-working photosensitive polybenzoxazoles (PBO) contain an alkaline soluble PBO precursor and a diazoquinone photoactive compound as shown in U.S. Pat. No. 4,371,685. The diazoquinone compound inhibits the solubility of the PBO precursor in an aqueous base. After exposure to light, the diazoquinone compound undergoes photolysis and converts to indenecarboxylic acid, which promotes the aqueous base solubility of the PBO precursor.

SUMMARY OF THE INVENTION

The present invention provides a positive photosensitive resin composition containing a silane diol such as diarylsilane diol or dialkylsilane diol, one or more capped polybenzoxazole precursors, a photosensitive agent (e.g. diazoquinone compound, dihydropyridine, or mixtures thereof), and a solvent.

In the present invention, a silane diol compound is an essential component of the positive acting, photoactive resin composition. In the present invention, the silane diol surprisingly acts as a dissolution inhibitor. This behavior is contrary to what one would expect, since in other systems such as those described in U.S. Pat. No. 5,856,065, a silane diol functions as a dissolution enhancer.

The present invention provides a positive photosensitive resin composition comprising a silane diol, one or more capped polybenzoxazole precursors, a photosensitive agent, and a solvent. The composition of the present invention exhibits several improvements over prior art compositions. For example, dissolution inhibition and crack resistance are noticeably improved. Furthermore, there is a decrease in swelling and skinning during exposure to aqueous developers, as compared to other compositions at a similar inhibition level. These improvements allow longer, more controlled development times resulting in increased develop process latitude.

DETAILED DESCRIPTION OF THE INVENTION

The silane diol compound can be, for example, a diarylsilane diol or a dialkylsilane diol. Most preferred is a diphenylsilane diol. The silane diol is included in the composition at about 0.1 wt. % to 10.0 wt. %, preferably at about 0.5 wt. % to 7.5 wt. %, and most preferably at about 1 wt. % to 5 wt.%.

One or more capped polybenzoxazole precursor polymers are formed by the reaction of a polybenzoxazole precursor (G) with a diazoquinone compound.

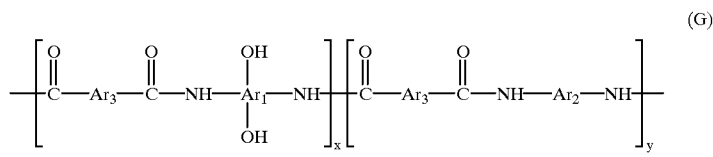

(G)

The polybenzoxazole precursor has a polymerization degree of 10–1000 and is synthesized by the reaction of monomers (A), (B), and (C) in the presence of a base:

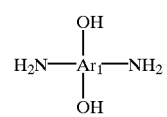

(A)

(B)

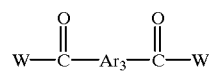

(C)

wherein x is 10 to 1000, and y is 0 to 900; $Ar_1$ is a tetravalent aromatic, aliphatic, or heterocyclic group; $Ar_2$ is a divalent aromatic, heterocyclic, alicyclic or aliphatic group; $Ar_3$ is a divalent aromatic, aliphatic or heterocyclic group, and W is Cl, OR and H; wherein R is —$CH_3$, —$C_2H_5$, n-$C_3H_7$, i-$C_3H_7$, n-$C_4H_9$, t-$C_4H_9$, cyclohexyl, and the like.

The ratio of [(A)+(B)]/(C) is generally between about 0.9 to 1.1. Monomer (A) is about 10–100 mole % of [(A)+(B)] and monomer (B) is about 0–90 mole % of [(A)+(B)]. The resulting polymer (G) is then reacted with about 1–35 mole % of a diazoquinone to produce capped polybenzoxazole precursor (F).

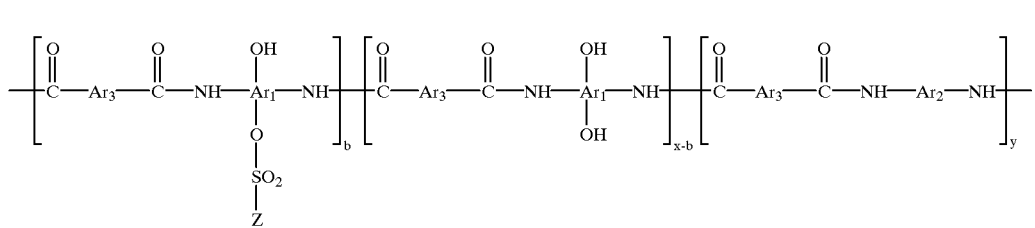

wherein Z is one of the following groups:

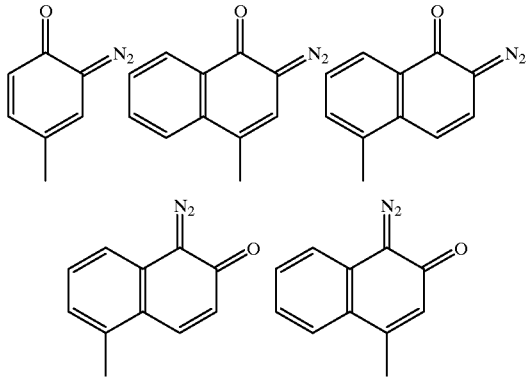

and x is 10 to 1000; y is 0 to 900; and b is 0.10 to 350.

In monomer (A), which is a constituent of polymers (G) and (F), $Ar_1$ is a tetravalent aromatic, aliphatic, or heterocyclic group, and can include the following moieties:

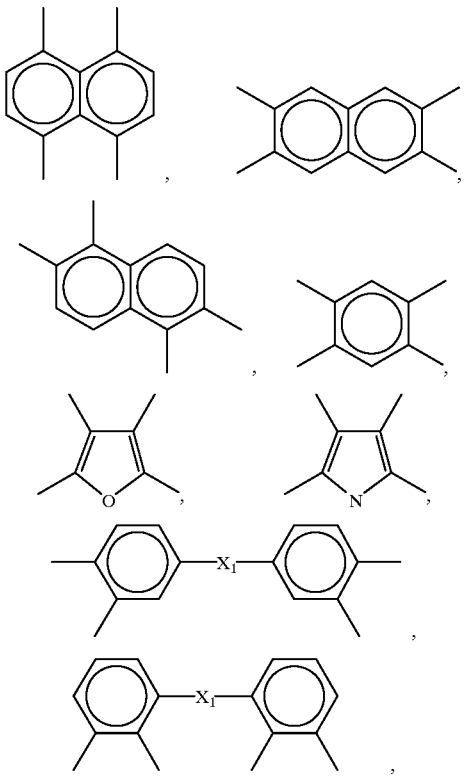

-continued wherein $X_1$ is —O—, —S—, —C(CF$_3$)$_2$—,

—CH$_2$—, —SO$_2$—, —NHCO—, or $-\underset{R^1}{\overset{R^1}{Si}}-$ ;

$R^1$ is alkyl or cycloalkyl, such as

—CH$_3$, —C$_2$H$_5$, n-C$_3$H$_7$, i-C$_3$H$_7$, n-C$_4$H$_9$, t-C$_4$H$_9$, cyclohexyl, and the like. However, $Ar_1$ is not restricted to these groups. Furthermore, monomer (A) may be a mixture of two or more monomers.

In monomer (B), which is a constituent of precursor (G) and capped precursor (F). $Ar_2$ is a divalent aromatic, heterocyclic, alicyclic, or aliphatic group that may or may not contain silicon. The $Ar_2$ containing monomer (B) includes, for example, 5(6)-diamino-1-(4-aminophenyl)-1, 3,3-trimethylindane (DAPI), m-phenylenediamine, p-phenylenediamine, 2,2'-bis(trifluoromethyl)-4,4'-diamino-1,1'-biphenyl, 3,4'-diaminodiphenyl ether, 4,4'-diaminodiphenyl ether, 3,3'-diaminodiphenyl ether, 2,4-tolylenediamine, 3,3'-diaminodiphenyl sulfone, 3,4'-diaminodiphenyl sulfone, 4,4'-diaminodiphenyl sulfone. 3,3'-diaminodiphenylmethane, 4,4'-diaminodiphenylmethane, 3,3 '-diaminodiphenylmethane, 3,4'-diaminodiphenylmethane, 4,4'-diaminodiphenyl ketone, 3,3'-diaminodiphenyl ketone, 3,4'-diaminodiphenyl ketone, 1,3-bis (4-aminophenoxy) benzene, 1,3-bis(3-amino-phenoxy) benzene, 1,4-bis (γ-aminopropyl) tetramethyldisiloxane, 2,3,5,6-tetramethyl-p-phenylenediamine, m-xylylenediamine, p-xylylenediamine, methylenediamine, tetramethylenediamine, pentamethylenediamine, hexamethylenediamine, 2,5-dimethylhexamethylenediamine, 3-methoxyhexamethylenediamine, heptamethylenediamine, 2,5-dimethylheptamethylenediamine, 3-methylheptamethylenediamine, 4,4-dimethylheptamethylenediamine, octamethylenediamine, nonamethylenediamine, 2,5-dimethylnonamethylenediamine, decamethylenediamine, ethylenediamine, propylenediamine, 2,2-dimethylpropylenediamine, 1,10-diamino-1,10-dimethyldecane, 2,11-diaminidodecane, 1,12-diaminooctadecane, 2,17-diaminoeicosane, 3,3'-dimethyl-4, 4'-diaminodiphenylmethane, bis(4-aminocyclohexyl) methane, 3,3'-diaminodiphenylethne, 4,4'-diaminodiphenylethne, and 4,4'-diaminodiphenyl sulfide, 2,6-diaminopyridine, 2,5-diaminopyridine, 2,6-diamino-4-trifluoromethylpyridine, 2,5-diamino-1,3,4,-oxadiazole, 1,4-diaminocyclohexane, piperazine, 4,4'-methylenedianiline, 4,4'-methylenebis(o-choloroaniline), 4,4'-methylene-bis(3-methylaniline), 4,4'-methylene-bis(2-ethylaniline), 4,4'-methylene-bis(2-methoxyaniline), 4,4'-oxy-dianiline, 4,4'-oxy-bis-(2-methoxyaniline), 4,4'-oxy-bis-(2-chloroaniline), 4,4'-thio-dianiline, 4,4'-thio-bis-(2-methylaniline), 4,4'-thio-bis-(2-methyoxyaniline), 4,4'-thio-bis-(2-chloroaniline), 3,3'sulfonyl-dianiline, 3,3'sulfonyl-dianiline, and mixtures thereof. However, it should be understood that monomer (B) is not restricted to these compounds.

In monomer (C), which is a constituent of polybenzoxazole precursor (G) or capped precursor (F), Ar$_3$ is a divalent aromatic or heterocyclic group, and includes, for example:

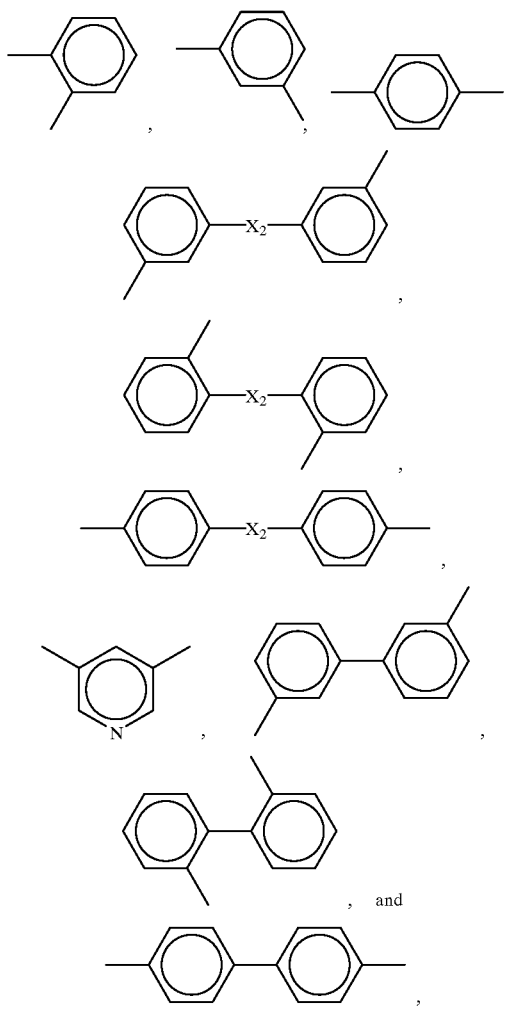

wherein X$_2$ is —O—, —S—, —C(CF$_3$)$_2$—, —CH$_2$—, —SO$_2$—, or —NHCO—. However, Ar$_3$ is not restricted to these groups. Furthermore, monomer (C) may be a mixture of two or more monomers.

The diazoquinone compound that is combined with the PBO precursor (G) can be one of the following:

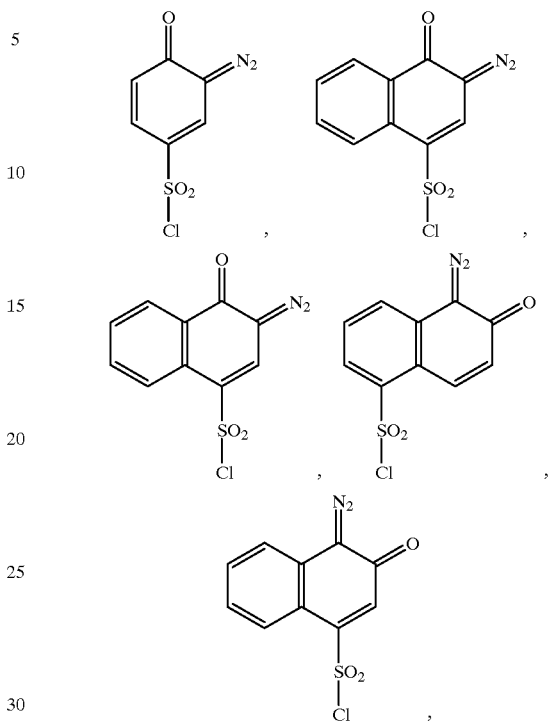

or mixtures thereof.

The preferred reaction solvents are N-methyl-2-pyrrolidone (NMP), γ- butyrolactone (GBL), N,N-dimethylformamide (DMF), N,N-dimethylacetamide (DMAc), dimethyl-2-piperidone, dimethylsulfoxide (DMSO), sulfolane, and diglyme. Most preferred are N-methyl-2-pyrrolidone (NMP) and γ- butyrolactone (GBL).

Any suitable reaction for reacting such dicarboxylic acid or its dichloride or diester with at least one aromatic and/or heterocyclic dihydroxydiamine, and optionally, with at least one diamine may be used. Generally, the reaction is carried out at about 10° C. to about 50° C. for about 6 to 48 hours. The molar ratio of diacid to (diamine+dihydroxydiamine) should be about 0.9–1.1:1.

The capped PBO precursor can be prepared according to the following reaction.

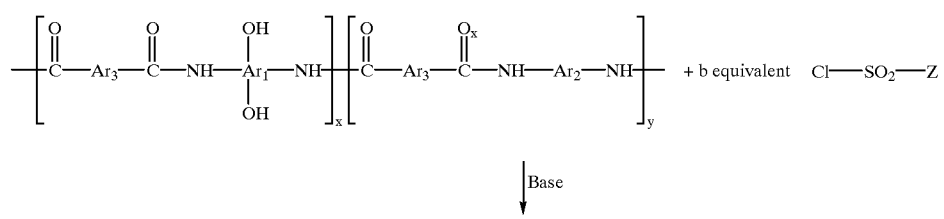

-continued

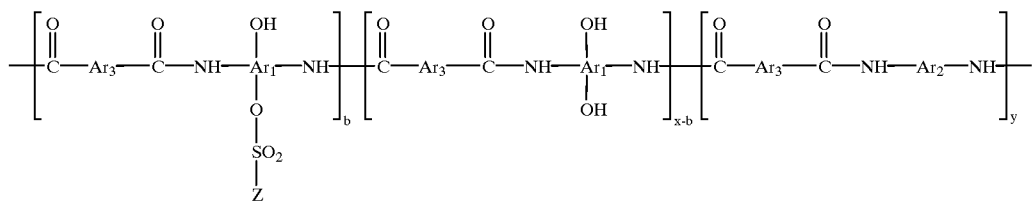

wherein Z is as previously defined.

Any suitable method for reacting a polybenzoxazole with the photoactive moiety Cl—SO$_2$—Z may be used. Generally, the reaction is carried out at about −10° C. to about 30° C. for about 3 to 24 hours in the presence of a base such as pyridine, trialkylamine, methylpyridine, lutidine, n-methylmorpholine, and the like. The most preferred base is triethylamine. The ratio of b/x is from 0.01 to 0.35. The more preferred b/x ratio is from 0.02 to 0.20 and most preferred is from 0.03 to 0.05. The reaction mixture should be protected from actinic rays.

The positive photosensitive resin composition includes one or more capped polybenzoxazole precursors at about 10 wt. % to 50 wt. %. Preferably, about 20 wt. % to 45 wt. %, and most preferably, about 30 wt. % to 40 wt. % of the capped polybenzoxazole precursor is added.

The photosensitive agent consists of a diazoquinone compound (H), dihydropyridine compound (I), or mixtures thereof. Suitable diazoquinone compounds can be, but are not limited to, one of the following structures:

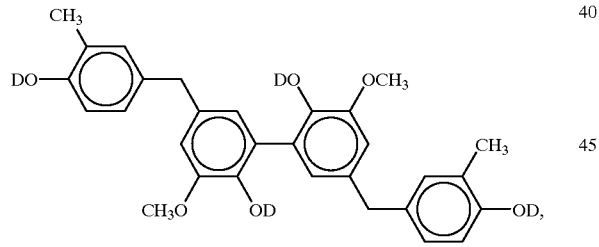

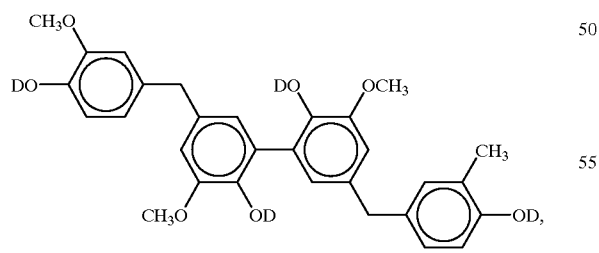

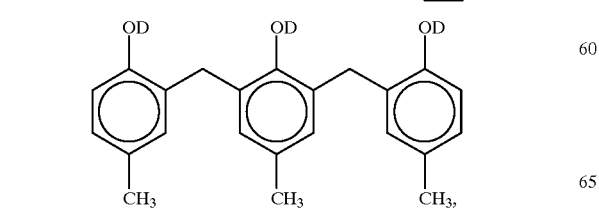

-continued

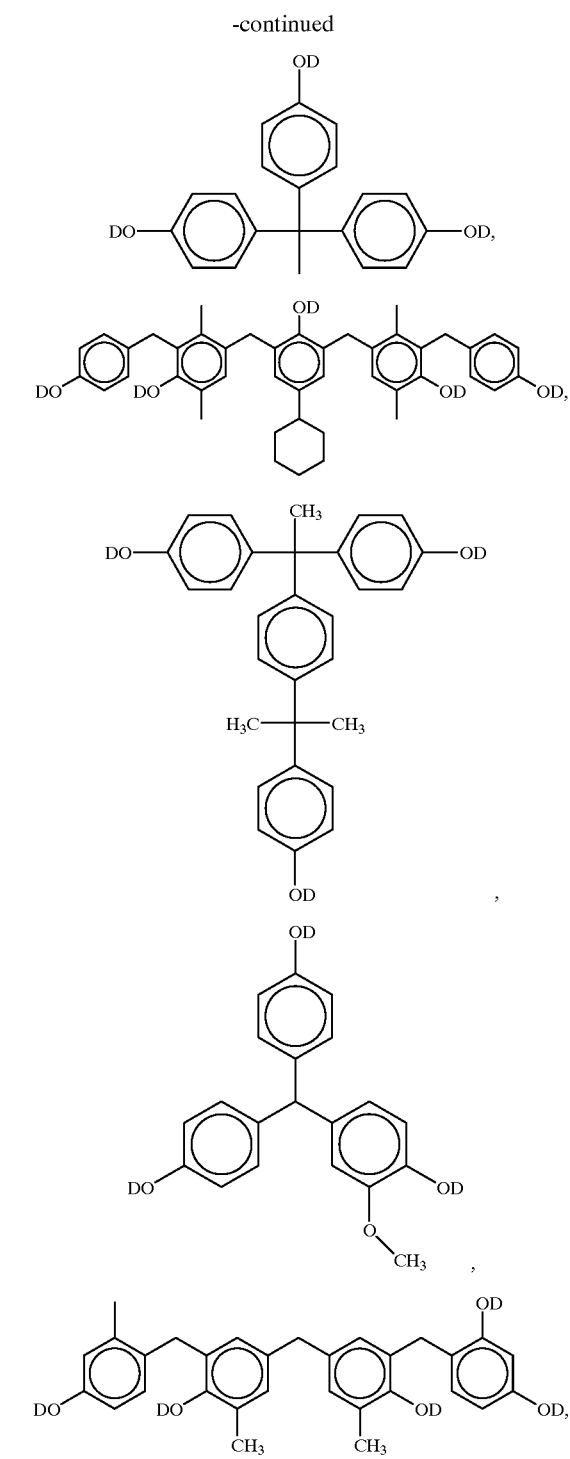

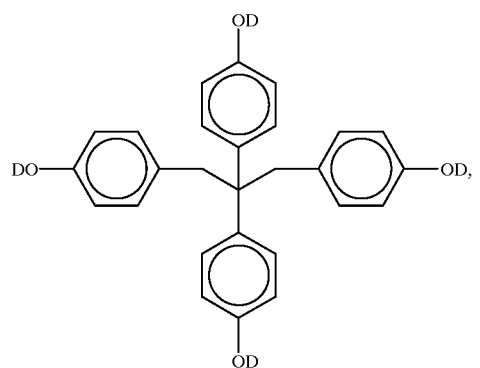
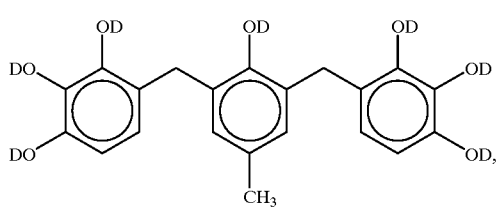
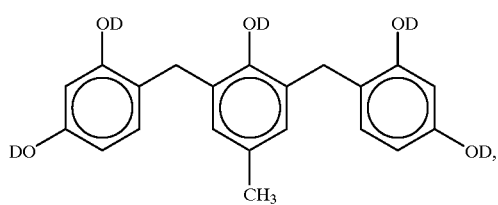
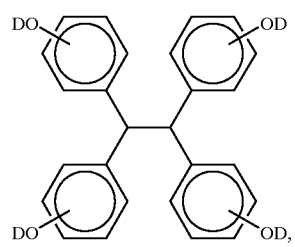
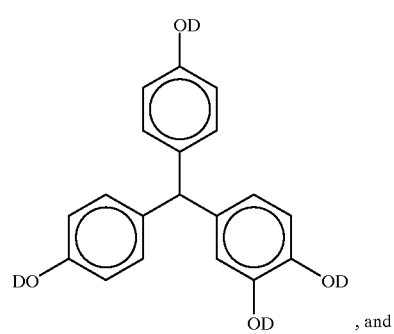
, and
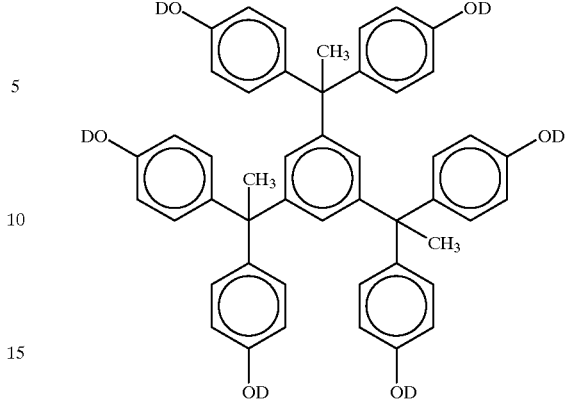
wherein D independently can be H or one of the following moieties:
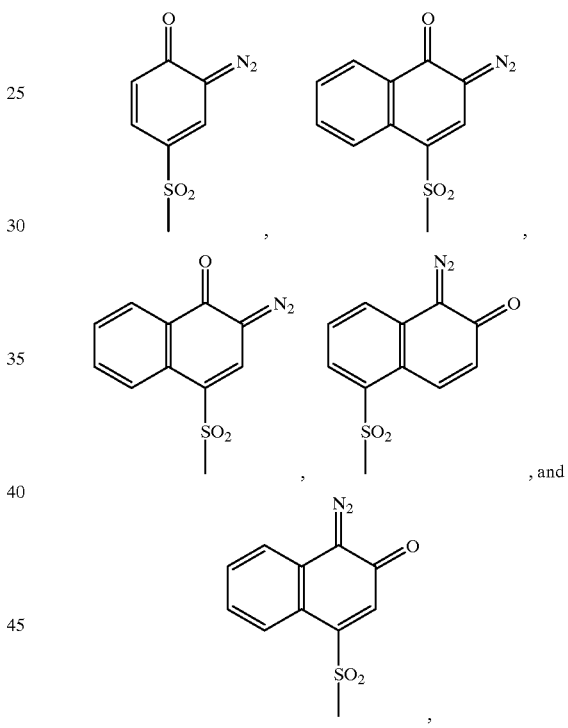
, and
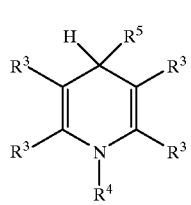
,
provided, however, in each compound at least one D is not H.
The dihydropyridine (I) can be, for example, a compound with the following structure:

wherein R³ groups are the same or different and have the following structure:

H, OH, COO—(CH$_2$)$_n$—CH$_3$, (CH$_2$)$_n$—CH$_3$, O—(CH$_2$)$_n$—CH$_3$, CO—(CH$_2$)$_n$—CH$_3$, (CF$_2$)$_n$—CF$_3$, C$_6$H$_5$, COOH, (CH$_2$)$_n$—O—(CH$_2$)m—CH$_3$, (CH$_2$)$_n$—OH, CH$_2$=CH—(CH$_2$)$_p$—CO—CH$_2$, F, Cl, Br or I;

m=0 to 10, n=0 to 10, and p=0 to 4;

R⁴ is H, C$_1$-C$_7$ alkyl, cycloalkyl, or phenyl and mono substituted phenyl;

R⁵ is

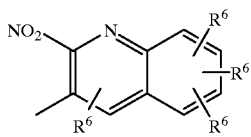

wherein R⁶ is defined the same as R³ and the NO$_2$ group is in the ortho position in respect to the dihydropyridine ring.

For example, the dihydropyridine may be:

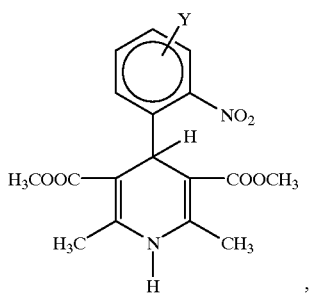

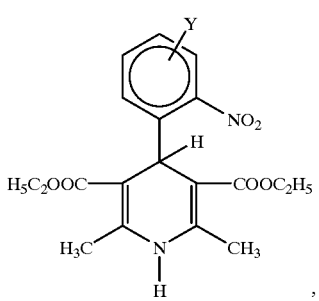

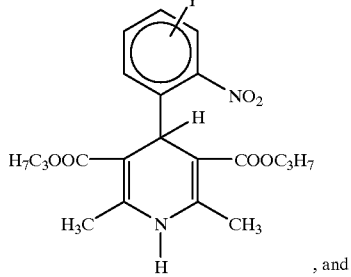, and

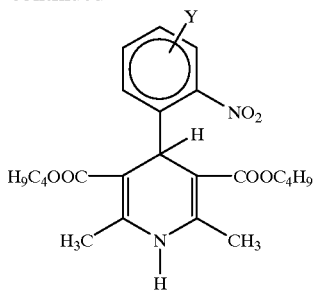

wherein, Y is —OR² where R² is a monovalent substituted or unsubstituted aromatic group or aliphatic group, CN, Cl, Br, or I.

Capped polybenzoxazole precursor (F) can be formulated with one or more diazoquinone compounds (H), one or more dihydropyridines (I), or mixtures thereof. The diazoquinone compound (H) used in this composition is about 1 wt % to 20 wt. % of the total weight of the composition, preferably, about 2 wt. % to 10 wt. %, and most preferably, about 3 wt. % to 5 wt. %. The amount of dihydropyridine compound (I) used in this composition is about 1 wt. % to 20 wt. % of the total weight of the composition, preferably, about 2 wt. % to 10 wt. %, and most preferably, about 3 wt. % to 5 wt. %. If both the diazoquinone compound (H) and the dihydropyridine compound (I) are used, the amount of (H)+(I) in this composition is about 1 wt. % to 20 wt. % of the total weight of the composition, preferably, about 2 wt. % to 10 wt. %, and most preferably, about 3 wt. % to 5 wt. %.

The positive acting, photoactive resin of this invention is used in a solution dissolved in a solvent. Suitable solvents include, but are not limited to organic solvents, such as N-methylpyrrolidone (NMP), γ-butyrolactone (GBL), N,N-dimethylacetamide (DMAc), dimethyl-2-piperidone, N,N-dimethylformamide (DMF), and mixtures thereof. The preferred solvents are γ-butyrolactone and N-methylpyrrolidone with γ-butyrolactone being the most preferred.

The present invention may further include additives. Suitable additives are, for example, adhesion promoters such as amino silanes, leveling agents, mixtures thereof, and the like.

In addition, the present invention includes a process for forming a relief pattern. The process comprises the steps of: (a) coating on a suitable substrate, a positive-working photosensitive composition comprising a silane diol, one or more capped polybenzoxazole precursors having the structure (F), a photosensitive agent, and a solvent, thereby forming a coated substrate; (b) exposing the coated substrate to actinic radiation; (c) post exposure baking the coated substrate at an elevated temperature; (d) developing the coated substrate with an aqueous developer, thereby forming a developed substrate; (e) rinsing the developed substrate; and (e) baking the rinsed substrate at an elevated temperature, thereby curing the relief pattern.

The positive acting, photoactive resin of this invention is coated on a suitable substrate such as a silicon wafer, a ceramic substrate, or the like. Coating methods include, but are not limited to spray coating, spin coating, offset printing, roller coating, screen printing, extrusion coating, meniscus coating, curtain coating, and immersion coating. The resulting film may optionally be prebaked at an elevated temperature of about 70–120° C. for several minutes to half an hour, depending on the method, to evaporate the remaining solvent. Subsequently, the resulting dry film is exposed to actinic rays in a preferred pattern through a mask. X-rays, electron beam, ultraviolet rays, visible light, and the like can be used as actinic rays. The most preferable rays are those with wavelength of 436 nm (g-line) and 365 nm (i-line).

Following exposure to actinic radiation, it is advantageous to heat the coated substrate to a temperature between about 70° C. and 120° C. The coated substrate is heated in this temperature range for a short period of time, typically several seconds to several minutes. This process step is commonly referred to in the art as post exposure baking.

The film is developed by an aqueous developer and a relief pattern is obtained. The aqueous developer includes the solution of alkalis such as an inorganic alkali (e.g., potassium hydroxide, sodium hydroxide, ammonia water), primary amines (e.g., ethylamine, n-propylamine), secondary amines (e.g. diethylamine, di-n-propylamine), tertiary amines (e.g., triethylamine), alcoholamines (e.g. triethanolamine), quaternary ammonium salts (e.g. tetramethylammonium hydroxide, tetraethylammonium hydroxide), and mixtures thereof. The most preferred developers are those containing tetramethylammonium hydroxide (TMAH). An appropriate amount of a surfactant can be added to the developer. Development can be carried out by means of immersion, spray, puddling, or other similar developing methods.

The relief pattern is then rinsed using deionized water. The oxazole ring is then formed by curing of the relief pattern to obtain the final pattern of high heat resistant polymer. Curing is performed by baking the developed substrate at the glass transition temperature $T_g$ of the polymer to obtain the oxazole ring that forms a final pattern of high heat resistance.

To illustrate the present invention, the following examples are provided. It should be understood that the present invention is not limited to the examples described.

SYNTHESIS EXAMPLE A

To a 2 L, three-necked, round bottom flask equipped with a mechanical stirrer, nitrogen inlet and addition funnel, 155.9 g (426.0 mmol) of hexafluoro-2,2-bis(3-amino-4-hydroxyphenyl)propane, 64.3 g (794.9 mmol) of pyridine, and 637.5 g of N-methylpyrrolidone (NMP) were added. The solution was stirred at room temperature until all solids dissolved, then cooled in an ice water bath at 0–5° C. To this solution, 39.3 g (194 mmol) of isophthalyl chloride, and 56.9 g (194 mmol) of 1,4-oxydibenzoyl chloride dissolved in 427.5 g of NMP, were added drop-wise. After the addition was completed, the resulting mixture was stirred at room temperature for 18 hours. The viscous solution was precipitated in 10 liters of vigorously stirred de-ionized water. The polymer was collected by filtration and washed with de-ionized water and a water/methanol (50/50) mixture. The polymer was dried under vacuum conditions at 105° C. for 24 hours.

The yield was almost quantitative and the inherent viscosity of the polymer was 0.24 dL/g measured in NMP at a concentration of 0.5 g/dL at 25° C.

SYNTHESIS EXAMPLE B

To a 2 L, three-necked, round bottom flask equipped with a mechanical stirrer, 200 g (370 mmol) of the polymer obtained from Synthesis Example A and 1000 mL of tetrahydrofuran (THF) were added. The mixture was stirred for 30 minutes and the solid was fully dissolved. Then 3.0 g (11.3 mmol) of 2,1-naphtoquinonediazide-5-sulfonic chloride was added and the mixture was stirred for another 30 minutes. Next, 1.36 g (13.6 mmol) triethylamine was added gradually over a period of 45 minutes and the reaction mixture was stirred for 5 hours. The reaction mixture was added gradually to 10 L of vigorously stirred de-ionized water. The precipitated product was separated by filtration and washed with 2 L of de-ionized water. Another 10 L of de-ionized water was added to the product and the mixture was vigorously stirred for 30 minutes. After filtration the product was washed with 2 L of de-ionized water. The isolated product was dried at 40° C. overnight. The yield of this reaction was 91%.

EXAMPLE 1

The formulation of the following composition was prepared by combining 28.1 wt. % of the PBO precursor of Synthesis Example B, 3.34 wt. % photoactive compound (PAC), 0.28 wt. % adhesion promoter, and 2.81 wt. % diphenylsilane diol dissolved in 65.47 wt. % GBL solvent to obtain a photosensitive resin composition.

The composition was then spin coated onto a silicon wafer and baked on a hotplate for 3 min at 120° C. to obtain a film of about 10 µm thick. This film was exposed on an i-line stepper and developed for 50s using a 0.262N aqueous TMAH solution followed by a DI water rinse. A resolution of 2 µm was obtained at 780 mJ/cm$^2$ with a film retention of 83.4% (unexposed film dissolution rate, $R_{min}$=1.82 µm/min). No cracking, peeling, or skinning was observed.

EXAMPLE 2

The formulation of the following composition was prepared by combining 28.1 wt. % of the PBO precursor of Synthesis Example B, 3.34 wt. % PAC, 0.28 wt % adhesion promoter, and 2.81 wt. % diphenylsilane diol dissolved in 65.47 wt. % GBL solvent to obtain a photosensitive resin composition.

The composition was then spin coated onto a silicon wafer and baked on a hotplate for 3 min at 120° C. to obtain a film of about 10.5 µm thick. This film was exposed on an i-line stepper and developed for 70s using a 0.262N aqueous TMAH solution followed by a DI water rinse. A resolution of 2 µm was obtained at 620 mJ/cm$^2$ with a film retention of 79% (unexposed film dissolution rate, $R_{min}$=1.9 µm/min). No cracking, peeling, or skinning was observed.

EXAMPLE 3

The formulation of the following composition was prepared by combining 28.1 wt. % of the PBO precursor of Synthesis Example B, 3.34 wt. % PAC, 0.28 wt. % adhesion promoter, and 2.81 wt. % diphenylsilane diol dissolved in 65.47 wt. % GBL solvent to obtain a photosensitive resin composition.

The composition was then spin coated onto a silicon wafer and baked on a hotplate for 3 min at 120° C. to obtain a film of about 10.5 µm thick. This film was exposed on an i-line stepper and developed for 70s using a 0.28N aqueous TMAH solution followed by a DI water rinse. A resolution of 2 µm was obtained at 560 mJ/cm$^2$ with a film retention of 75.2%. No cracking, peeling, or skinning was observed.

EXAMPLE 4

The formulation of the following composition was prepared by combining 28.1 wt. % of the PBO precursor of Synthesis Example B, 3.34 wt. % PAC, 0.28 wt. % adhesion promoter, and 2.81 wt. % diphenylsilane diol dissolved in 65.47 wt. % GBL solvent to obtain a photosensitive resin composition.

The composition was then spin coated onto a silicon wafer and baked on a hotplate for 3 min at 120° C. to obtain a film of about 10.5 μm thick. This film was exposed on an i-line stepper and developed for 60s using a 0.33N aqueous TMAH solution followed by a DI water rinse. A resolution of 2 μm was obtained at 460 mJ/cm² with a film retention of 71%. No cracking, peeling, or skinning was observed.

COMPARATIVE EXAMPLE 1

The formulation of the following composition was prepared by combining 28.91 wt. % of the PBO precursor of Synthesis Example B, 3.44 wt. % PAC, and 0.29 wt. % adhesion promoter dissolved in 67.36 wt. % GBL solvent to obtain a photosensitive resin composition.

The composition was then spin coated onto a silicon wafer and baked on a hotplate for 3 min at 120° C. to obtain a film of about 9.8 μm thick. This film was exposed on an i-line stepper and developed for 60s using a 0.262N aqueous TMAH solution followed by a DI water rinse. Energy to clear was 260 mJ/cm² with a film retention of 54.8%. Similar exposure to the developer of synthesis examples A and B, but the unexposed film was severely attacked.

COMPARATIVE EXAMPLE 2

The formulation of the following composition was prepared by combining 28.91 wt. % of the PBO precursor of Synthesis Example B, 3.44 wt. % PAC and 0.29 wt. % adhesion promoter dissolved in 67.36 wt. % GBL solvent to obtain a photosensitive resin composition.

The composition was then spin coated onto a silicon wafer and baked on a hotplate for 3 min at 120° C. to obtain a film of about 9.9 μm thick. This film was exposed on an i-line stepper and developed for 30s using a 0.262N aqueous TMAH solution followed by a DI water rinse. Energy to clear was 820 mJ/cm² with a film retention of 78.6%. No cracking, peeling, or skinning was observed.

COMPARATIVE EXAMPLE 3

The formulation of the following composition was prepared by combining 28.91 wt. % of the PBO precursor of Synthesis Example B. 3.44 wt. % PAC, and 0.29 wt. % adhesion promoter dissolved in 67.36 wt. % GBL solvent to obtain a photosensitive resin composition.

The composition was then spin coated onto a silicon wafer and baked on a hotplate for 3 min at 120° C. to obtain a film of about 9.7 μm thick. This film was exposed on an i-line stepper and developed for 40s using a 0.262N aqueous TMAH solution followed by a DI water rinse. Energy to clear was 480 mJ/cm² with a film retention of 71.6%. The difference of 10s in development time, drastically changed the energy and film retention values which signifies a very sensitive development process.

COMPARATIVE EXAMPLE 4

The formulation of the following composition was prepared by combining 28.9 wt. % of a PBO precursor at a slightly higher molecular weight with 0.5% w/w attached DNQ, 3.47 wt. % PAC, and 0.29 wt. % adhesion promoter dissolved in 67.34 wt. % GBL solvent to obtain a photosensitive resin composition.

The composition was then spin coated onto a silicon wafer and baked on a hotplate for 3 min at 120° C. to obtain a film of about 8.3 μm thick. This film was exposed on an i-line stepper and developed for 40s using a 0.262N aqueous TMAH solution followed by a DI water rinse. Energy to clear was 540 mJ/cm² with a film retention of 76% ($R_{min}$= 2.99 μm/min). Cracking, peeling, and skinning were observed. The inhibition level of this composition is not as high as in examples 1 and 2 (which use the same developer), yet unlike these examples, this film exhibits signs of excessive swelling and stress caused by the develop process.

The present invention has been described with particular reference to the preferred forms thereof. It will be obvious to one of ordinary skill in the art that changes and modifications may be made therein without departing from the spirit and scope of the present invention as defined by the following claims.

What is claimed is:

1. A positive photosensitive resin composition comprising:

(a) a silane diol,
   (b) one or more capped polybenzoxazole precursors having the structure,

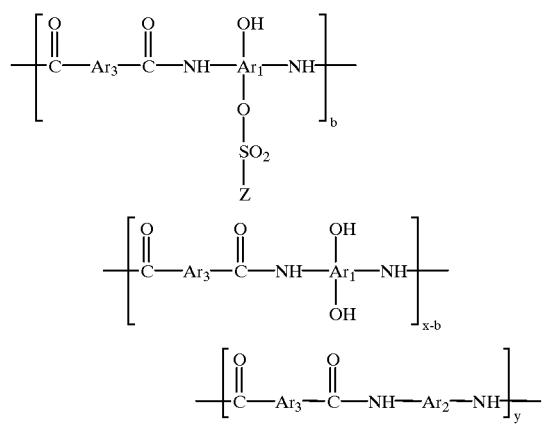

wherein $Ar_1$ is a tetravalent aromatic group, aliphatic group, heterocyclic group, or mixtures thereof; $Ar_2$ is a divalent aromatic, heterocyclic, alicyclic, or aliphatic group that optionally may contain silicon; $Ar_3$ is divalent aromatic group, aliphatic group, heterocyclic group, or mixtures thereof;

Z is one of the following groups:

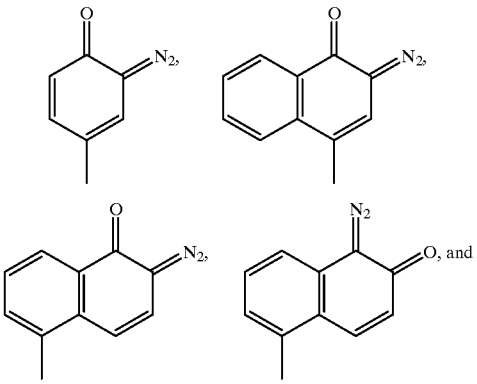

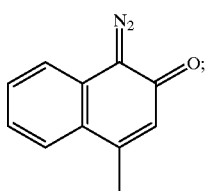

x is 10 to 1000; y is 0 to 900; and b is 0.10 to 350;

(c) a photosensitive agent, and (d) a solvent.

2. The composition of claim 1, wherein said silane diol is about 0.1 wt. % to 10.0 wt. % of the total weight of said composition.

3. The composition of claim 1, wherein said silane diol is selected from the group consisting of diarylsilane diol, dialkylsilane diol, and mixtures thereof.

4. The composition of claim 3, wherein said silane diol is diphenylsilane diol.

5. The composition of claim 1, wherein said capped polybenzoxazole precursor is about 10 wt. % to 50 wt. %.

6. The composition of claim 1, wherein said capped polybenzoxazole precursor has a polymerization degree of 10–1000.

7. The composition of claim 1, wherein $Ar_1$ is hexafluoro propane-2,2-(biphenyl) radical and $Ar_3$ is a radical selected from the group consisting of a phthaloyl, or a 1,4-oxydibenzoyl, and mixtures thereof.

8. The composition of claim 1, wherein said photosensitive agent is about 1 wt. % to 20 wt. % of the total weight of said composition.

9. The composition of claim 1, wherein said photosensitive agent is selected from the group consisting of a diazoquinone compound, a dihydropyridine compound, and mixtures thereof.

10. The composition of claim 9, wherein said photosensitive agent is a diazoquinone compound with a structure selected from the group consisting of:

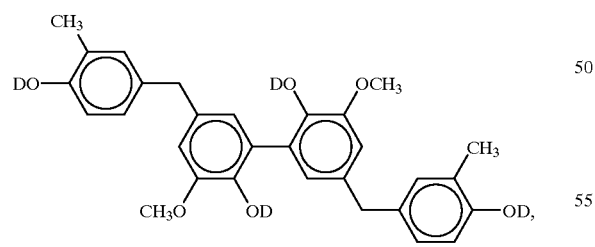

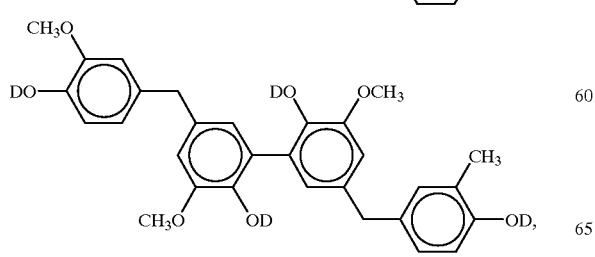

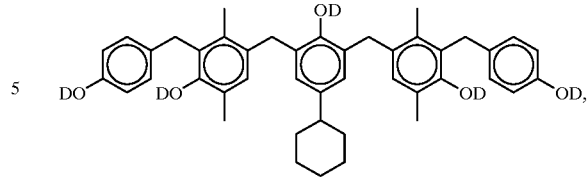

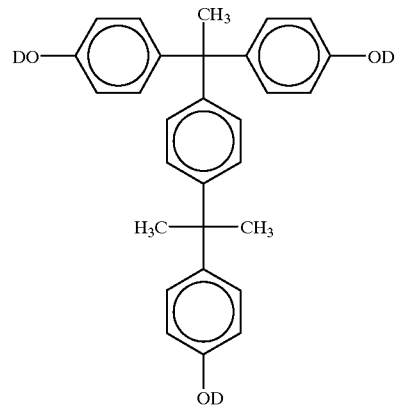

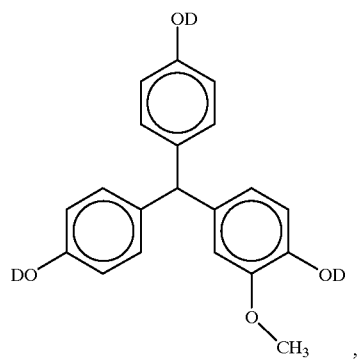

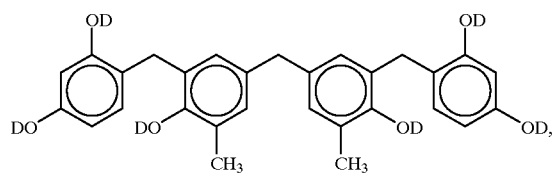

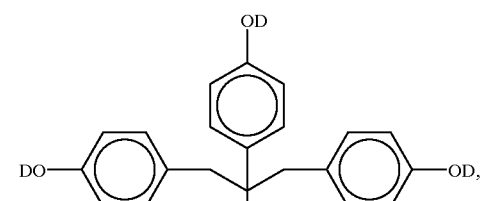

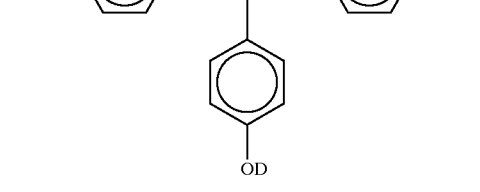

-continued

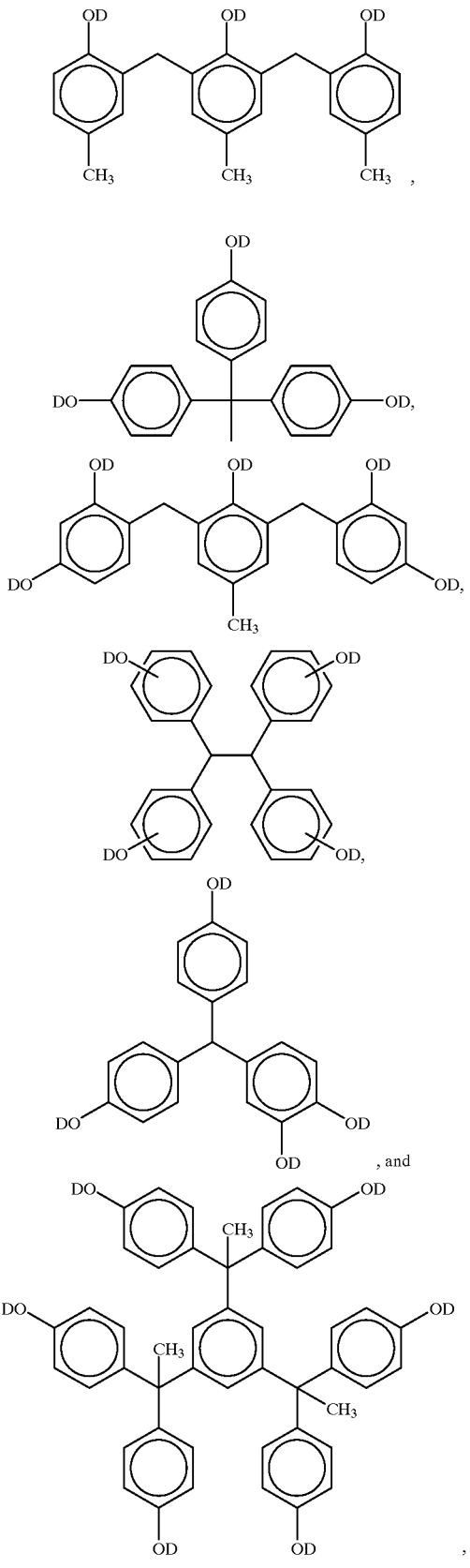

wherein D independently can be H or one of the following moieties:

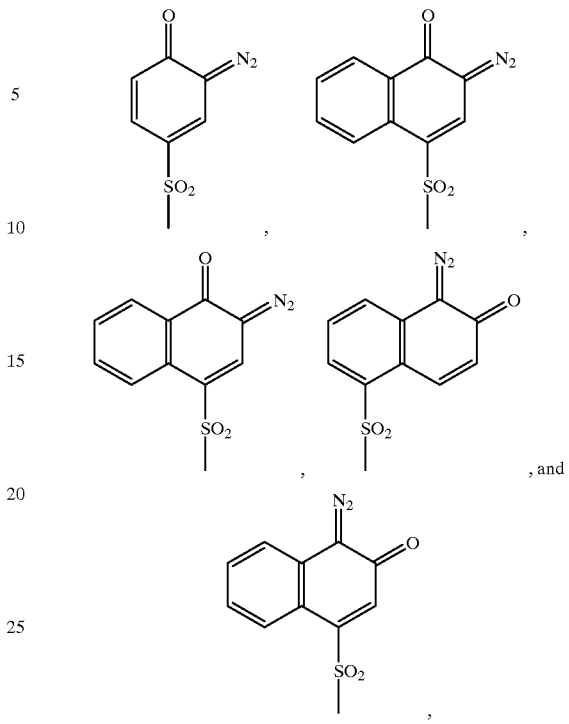

, and

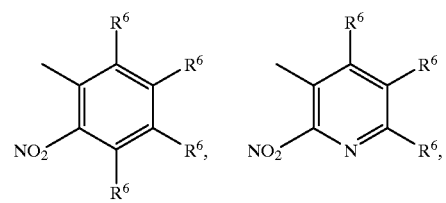

, provided, however, in each compound at least one D is not H.

11. The composition of claim 9, wherein said photosensitive agent is a dihydropyridine compound having the structure:

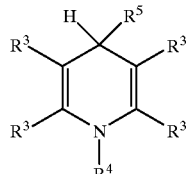

wherein $R^3$ groups are the same or different and have the following structure:

H, OH, COO—$(CH_2)_n$—$CH_3$, $(CH_2)_n$—$CH_3$, O—$(CH_2)_n$—$CH_3$, CO—$(CH_2)_n$—$CH_3$, $(CF_2)_n$—$CF_3$, $C_6H_5$, COOH, $(CH_2)n$—O—$(CH_2)m$—$CH_3$, $(CH_2)_n$—OH, $(CH=CH)_p$—CO—$CH_3$, F, Cl, Br or I;

m=0 to 10, n=0 to 10, and p=1 to 4;

$R^4$ is H, $C_1$-$C_7$ alkyl, cycloalkyl, or phenyl and mono substituted phenyl;

$R^5$ is

-continued

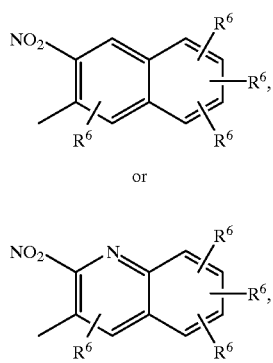

or wherein R[6] is defined the same as R[3] and the $NO_2$ group is in the ortho position in respect to the dihydropyridine ring.

12. The composition of claim 11, wherein said photosensitive agent is a dihydropyridine compound with a structure selected from the group consisting of:

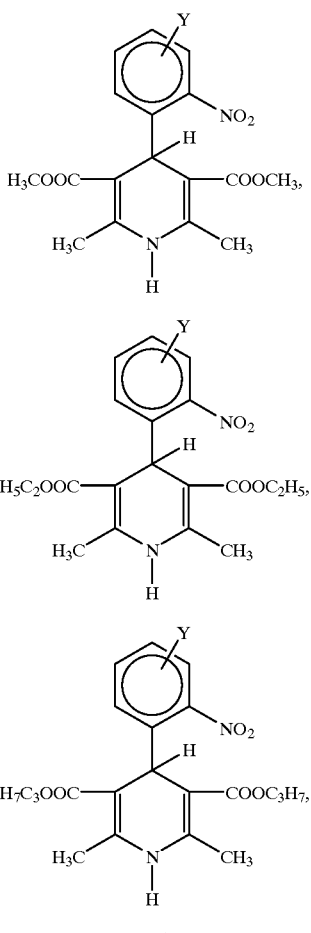

and

-continued

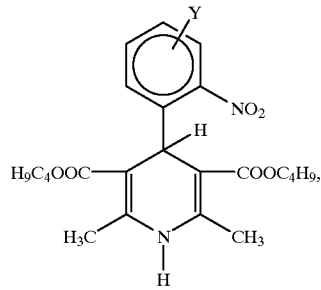

wherein, Y is —$OR^2$ where $R^2$ is a monovalent substituted or unsubstituted aromatic or aliphatic group, CN, Cl, Br, or I.

13. The composition of claim 1, wherein said solvent is selected from the group consisting of N-methylpyrrolidone, γ-butyrolactone, N,N-dimethylacetamide, dimethyl-2-piperidone, N,N-dimethylformamide, and mixtures thereof.

14. The composition of claim 12, wherein said solvent is γ-butyrolactone.

15. The composition of claim 1, further comprising one or more additives selected from the group consisting of adhesion promoters, leveling agents, and mixtures thereof.

16. A positive photosensitive resin composition comprising:

about 0.1 wt. % to about 10.0 wt. % of a silane diol;
about 10 wt. % to about 50 wt. % of one or more capped polybenzoxazole precursors having the structure:

$$\left[\begin{array}{c}\overset{O}{\underset{\|}{C}}-Ar_3-\overset{O}{\underset{\|}{C}}-NH-\underset{\underset{SO_2}{\underset{|}{O}}}{Ar_1}-NH\end{array}\right]_b$$
$$\underset{Z}{|}$$

$$\left[\begin{array}{c}\overset{O}{\underset{\|}{C}}-Ar_3-\overset{O}{\underset{\|}{C}}-NH-\underset{\underset{OH}{|}}{Ar_1}-NH\end{array}\right]_{x-b}$$

$$\left[\overset{O}{\underset{\|}{C}}-Ar_3-\overset{O}{\underset{\|}{C}}-NH-Ar_2-NH\right]_y$$

wherein $Ar_1$ is a tetravalent aromatic group, aliphatic group, heterocyclic group, or mixtures thereof; $Ar_2$ is a divalent aromatic, heterocyclic, alicyclic, or aliphatic group that may or may not contain silicon; $Ar_3$ is divalent aromatic group, aliphatic group, heterocyclic group, or mixtures thereof;

Z is one of the following groups:

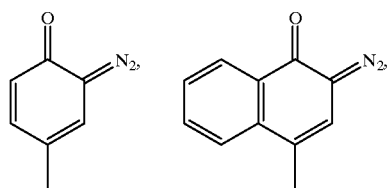

-continued

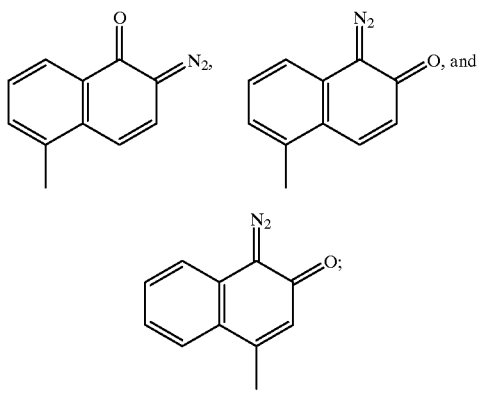

x is 10 to 1000; y is 0 to 900; and b is 0.10 to 350;

about 1 wt. % to about 20 wt. % of a photosensitive agent; and a solvent.

17. A process for forming a relief pattern, comprising the steps of:

a) coating on a substrate, a positive photosensitive resin composition comprising a silane diol, one or more capped polybenzoxazole precursors having the structure:

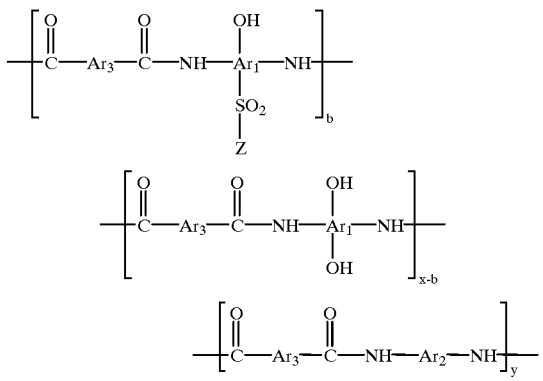

wherein $Ar_1$ is a tetravalent aromatic group, heterocyclic group, or mixtures thereof; $Ar_2$ is a divalent aromatic, heterocyclic, alicyclic, or aliphatic group that may or may not contain silicon; $Ar_3$ is divalent aromatic group, heterocyclic group, or mixtures thereof;

Z is one of the following groups:

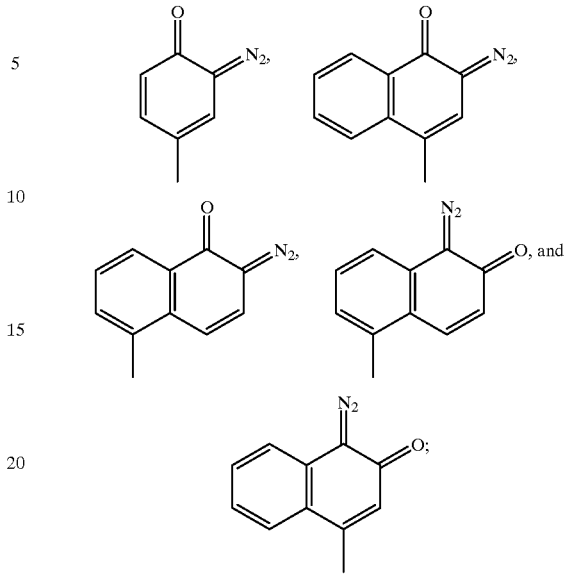

x is 10 to 1000; y is 0 to 900; and b is 0.10 to 350;

a photosensitive agent, and a solvent, thereby forming a coated substrate;

b) exposing said coated substrate to actinic radiation;

c) post exposure baking said coated substrate at an elevated temperature;

d) developing said coated substrate with an aqueous developer, thereby forming a developed substrate;

e) rinsing the developed substrate; and f) curing the rinsed substrate at an elevated temperature, thereby forming the relief pattern.

18. The process of claim 17, further comprising the step of prebaking said coated substrate, after said coated substrate is formed and before exposing said coated substrate.

19. The process of claim 17, wherein said actinic rays are selected from the group consisting of X-rays, electron beam rays, ultraviolet rays, and visible light rays.

20. The process of claim 17, wherein said actinic rays have a wavelength of 436 nm and 365 nm.

21. The process of claim 17, wherein said aqueous developer is a solution selected from the group consisting of alkalis, primary amines, secondary amines, tertiary amines, alcoholamines, quaternary ammonium salts, and mixtures thereof.

22. The process of claim 17, wherein said silane diol is diphenylsilane diol.

* * * * *